US010437152B2

(12) United States Patent
Becker et al.

(10) Patent No.: US 10,437,152 B2
(45) Date of Patent: Oct. 8, 2019

(54) FLEXOGRAPHIC PRINTING ELEMENTS THAT CAN BE DRIED RAPIDLY

(71) Applicant: Flint Group Germany GmbH, Stuttgart (DE)

(72) Inventors: Armin Becker, Großniedesheim (DE); Jochen Unglaube, Kenzingen (DE); Andrea Wochele, Ditzingen (DE)

(73) Assignee: Flint Group Germany GmbH (DE)

( * ) Notice: Subject to any disclaimer, the term of this patent is extended or adjusted under 35 U.S.C. 154(b) by 41 days.

(21) Appl. No.: 15/315,161

(22) PCT Filed: Jun. 2, 2015

(86) PCT No.: PCT/EP2015/062196
§ 371 (c)(1),
(2) Date: Nov. 30, 2016

(87) PCT Pub. No.: WO2015/185523
PCT Pub. Date: Dec. 10, 2015

(65) Prior Publication Data
US 2017/0199462 A1 Jul. 13, 2017

(30) Foreign Application Priority Data
Jun. 3, 2014 (EP) .................................... 14170874

(51) Int. Cl.
*G03F 7/20* (2006.01)
*G03F 7/09* (2006.01)
(Continued)

(52) U.S. Cl.
CPC ................ *G03F 7/202* (2013.01); *B41F 5/24* (2013.01); *G03F 7/092* (2013.01); *G03F 7/26* (2013.01);
(Continued)

(58) Field of Classification Search
CPC ........................................................ G03F 7/20
See application file for complete search history.

(56) References Cited

U.S. PATENT DOCUMENTS

| 5,262,275 A | * | 11/1993 | Fan | G03F 7/202 430/271.1 |
| 6,171,758 B1 | * | 1/2001 | Bhateja | G03F 7/09 430/11 |
| 6,355,395 B1 | | 3/2002 | Zwez et al. | |
| 9,599,902 B2 | | 3/2017 | Becker et al. | |

FOREIGN PATENT DOCUMENTS

| CN | 101473269 A | 7/2001 |
| EP | 1014194 A1 | 6/2000 |

(Continued)

OTHER PUBLICATIONS

International Preliminary Examination Report with Annexes (in German) for PCT/EP2015/062196 dated May 11, 2016.
(Continued)

*Primary Examiner* — Chanceity N Robinson
(74) *Attorney, Agent, or Firm* — Drinker Biddle & Reath LLP

(57) ABSTRACT

Photopolymerizable, preferably digitally imageable photopolymerizable, flexographic printing elements having a PET support sheet of low thermal shrinkage, methods of preparing such flexographic printing elements and their use for making flexographic printing plates by imagewise exposure to light, washing out with organic solvents and drying, wherein said drying is carried out at temperatures of more than 60° C.

18 Claims, 1 Drawing Sheet

Test motif with register crosses, 840 mm by 840 mm, the arrow indicating the extrusion direction of the flexographic printing plate

(51) Int. Cl.
  *G03F 7/26* (2006.01)
  *G03F 7/30* (2006.01)
  *G03F 7/34* (2006.01)
  *G03F 7/40* (2006.01)
  *B41F 5/24* (2006.01)
(52) U.S. Cl.
  CPC .............. *G03F 7/3042* (2013.01); *G03F 7/34* (2013.01); *G03F 7/40* (2013.01)

(56) References Cited

FOREIGN PATENT DOCUMENTS

| EP | 1457823 A2 | 9/2004 |
| EP | 1594005 A2 | 11/2005 |
| EP | 2284609 A2 | 2/2011 |
| WO | WO-9403838 A1 | 2/1994 |
| WO | WO-9614603 A1 | 5/1996 |
| WO | WO-2005121898 A1 | 12/2005 |
| WO | WO-2012145111 A1 | 10/2012 |

OTHER PUBLICATIONS

International Search Report for PCT/EP2015/062196 dated Jul. 30, 2015.
International Preliminary Report on Patentability with English Translation for application No. PCT/EP2015/062196, dated Dec. 8, 2016.

* cited by examiner

Test motif with register crosses, 840 mm by 840 mm, the arrow indicating the extrusion direction of the flexographic printing plate
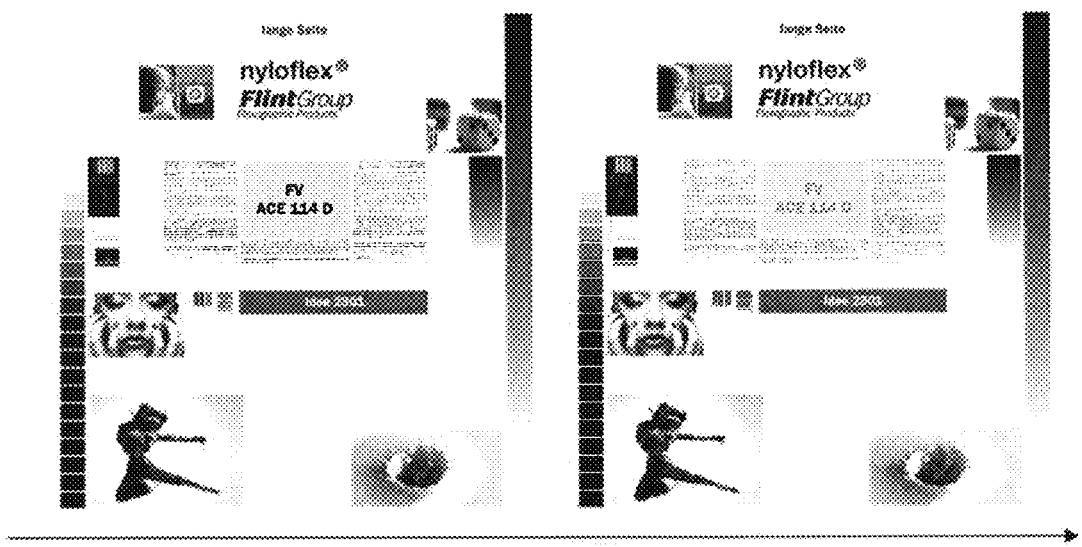

FLEXOGRAPHIC PRINTING ELEMENTS THAT CAN BE DRIED RAPIDLY

CROSS-REFERENCE TO RELATED APPLICATIONS

This application is a national stage application (under 35 U.S.C. § 371) of PCT/EP2015/062196, filed Jun. 2, 2015, which claims benefit of European Application No. 14170874.3, filed Jun. 3, 2014, both applications of which are incorporated herein by reference in their entirety.

The present invention relates to photopolymerizable, preferably digitally imageable photopolymerizable, flexographic printing elements having a PET support sheet of low thermal shrinkage, methods of preparing such flexographic printing elements and their use for making flexographic printing plates by imagewise exposure to light, washing out with organic solvents and drying, wherein said drying is carried out at temperatures of more than 60° C.

BACKGROUND OF THE INVENTION

Laser-ablatable flexographic printing elements are known in principle. They comprise at least a dimensionally stable support, a photopolymerizable layer and a laser-ablatable layer, also called an LAMS (laser-ablatable mask system). The laser-ablatable layer is generally protected by a peelable protective sheet known as the coversheet. The photopolymerizable layer may be constructed of water-soluble components, but particularly organosolvent-soluble photopolymerizable layers are widely used. Flexographic printing elements of this type are also referred to as digitally imageable flexographic printing elements.

Flexographic printing forms are made from photopolymerizable laser-ablatable flexographic printing elements via a multistepped process using dedicated equipment for each step. So the process is complex and time consuming.

First the coversheet is peeled off and a mask is written into the laser-ablatable layer by using an IR laser. Laser apparatus featuring a rotating drum, flat-bed apparatus or internal-drum lasers may be concerned at this stage.

After the mask has been written into the laser ablatable layer, the flexographic printing element is exposed to UV or UV/VIS radiation through the mask formed.

The photopolymerizable layer undergoes polymerization in the areas no longer concealed by the mask, whereas no polymerization occurs in the concealed areas. This is done using UV exposure units, which may comprise various sources of UV, for example UV tubes or UV LEDs.

After exposure, the remnants of the mask and also the unpolymerized portions of the photopolymerizable layer are removed. This can be done using one or more solvents or else thermally. The washout with solvents is done using specific types of washout equipment, for example brush washers. Thermal development may utilize equipment where an absorbent nonwoven is pressed by a heated roller against the exposed layer.

In the course of washout by means of organic solvents, the unpolymerized portions of the relief-forming layer dissolve in the solvent. The washout media used are typically mixtures comprising high-boiling hydrocarbons (boiling range typically about 150° C. to 200° C.). The polymerized portions of the layer do not dissolve and remain after the washout step to form the printing relief. But they do nonetheless swell in the washout media. When solvents are used to develop the plate, therefore, a drying step in a dryer follows. The drying step is typically carried out in circulating air dryers at a temperature of not more than 60° C.

After the drying step, the surface of the flexographic printing form obtained is usually aftertreated, for example by exposing the surface to UVA and/or UVC radiation. This again requires dedicated exposure equipment.

The rate-determining step in the making of flexographic printing plates is the step of drying the washed flexographic printing plates. Exposure, washout and after-treatment generally require from 10 to 20 minutes each. The length of the drying step, by contrast, varies with the plate type used and particularly the plate thickness in the range from at least 60 minutes up to 3 or 4 hours. The long drying period in the case of thick flexographic plates in particular is needed in order to effect ideally quantitative removal from the flexographic printing plate of even residues of the high-boiling washout media. To determine the drying period, it is customary to measure the layer thickness of the flexographic printing plate before and after washout and then compare it with the layer thickness of the flexographic printing plate after different drying periods. Drying can also be tracked via the decreasing weight of the flexographic printing plate during drying.

Residues of washout media in the relief layer have an adverse effect on the printing result. The fine halftones are then higher than the uniform areas and the tonal value gain at low tonal values increases. Fine halftone vignettes can no longer be printed. An adequate drying period is accordingly indispensable.

The drying period therefore has a crucial bearing on the total time needed to make a flexographic printing plate. With the drying periods described, it is not possible to do flexographic printing jobs promptly; instead a lead time of at least one day is required before a job can be realized in a printing press. This is uneconomical in an age of ever shorter jobs, often split into numerous repeat jobs. Moreover, in the event of a flexographic printing plate being damaged, it is impossible to provide a replacement at short notice; instead the printing job has to be discontinued. The next day, all the flexographic printing plates have to be remounted before the job can be completed, which again takes time and money.

There accordingly has been no shortage of attempts to eliminate this disadvantageous property of flexographic printing forms and to shorten the drying period.

It will be appreciated that in principle the drying rate can be increased by raising the drying temperature. But attempts to accelerate the drying rate of commercially available flexographic printing plates by raising the drying temperature led to problems with plate quality. The flexographic plates dried at higher temperature gave rise to register problems in printing. Flexographic printing plates have to have an excellent level of dimensional stability because several inks are printed together. Registration accuracy, i.e., the accuracy with which the individual elements of an image are combined in printing, is about 0.1 to 0.2 mm in the case of a printed width of about one meter. Dimensional stability for a flexographic printing plate accordingly has to be better than 0.02%.

The reason for the register problems of commercially available flexographic printing plates dried at higher temperature is the thermal behavior of the polyester support sheet supporting the photopolymerizable layer of the flexographic printing plate. Commercially available polyester sheets used in the manufacture of commercially available flexographic printing plates shrink on heating to temperatures above the glass transition temperature of polyester (about 70° C.). It is accordingly necessary to set the drying temperature at below the glass transition temperature in order to foreclose any distortion or warpage due to uncontrollable shrinkage. WO 2005/121898 A1 describes a method wherein the drying of flexographic printing plates is accelerated by additional irradiation with visible light. However, this method did not yield consistent results and therefore failed to become established in the market.

Water-washable flexographic printing plates are known as an alternative to solvent-washable plates. Water-washable flexographic printing plates dry distinctly faster than flexographic printing plates washed out in organic solvents, since the boiling point of water is lower than that of organic washout agents. However, the quality and press life of water-washable flexographic printing plates is inferior to the quality of flexographic printing plates washed out in organic solvents.

Thermally developable flexographic printing plates are known as a further alternative to solvent-washable plates. In thermal development, the unpolymerized areas are heated to the point of forming a liquid melt and the melt is absorbed using an absorbent material. Thermally developable flexographic printing plates do not require a drying step. However, thermal flexographic printing plates fall far short of the quality of flexographic printing plates washed out in organic solvents.

WO 96/14603 A1 proposes photopolymerizable flexographic printing elements for thermal development which comprise a dimensionally stable, flexible, polymeric support and a photopolymerizable elastomeric layer, wherein the plate has a thermal distortion in both the longitudinal and the transversal directions which is less than 0.03% when the plate, after imagewise exposure to light, is developed at temperatures of 100 to 180° C.

The flexographic printing element is formed using support sheets composed of semicrystalline polymers. A multiplicity of different materials are recited as suitable, such as polyethylene naphthalate (PEN), polyethylene terephthalate, polyether ketones, polytetrafluoroethylene, polyamides, syndiotactic polystyrene and polyphenylene sulfide. The sheets are annealed before use.

The flexographic printing elements of WO 96/14603 A1 are formed according to the examples by annealing a PEN support sheet 0.178 mm thick at 160° C. under a defined tension. The substrates are then corona treated and coated with an aziridine primer. They are then laminated with a photopolymerizable elastomeric layer. To make flexographic printing plates, the flexographic printing elements are imagewise exposed through a negative and then thermally developed, the developer roll having a temperature of 176° C. The photopolymerizable layer is from 0.3 mm to 3 mm in thickness. WO 96/14603 A1 does not disclose processing the flexographic elements by using washout media.

"Nonshrinking" polyester sheets, having a low degree of thermal shrinkage, are known in principle and also commercially available. Sheets of this type are typically formed by extrusion from a sheet die and subsequent stretching in the machine direction and in the transversal direction. This stretching operation takes place above the glass transition temperature, as a consequence of which commercially available PET sheets usually have different shrinkage values in the machine direction (MD) and the transversal direction (TD). In order, then, to render the sheets nonshrinking they are heated to the required temperature and maintained in a tensionless state for a defined period so that shrinkage stresses present can relax. Thereafter, the PET sheet is cooled down to below the glass transition temperature before being subjected to tensile stress. PET sheets thus obtained have shrinkage values of less than 0.02%.

However, use of a nonshrinking film in the manufacture of flexographic printing elements according to existing processes does not lead to flexographic printing plates possessing excellent accuracy of register, since the sheets come under renewed thermal stress in the course of forming the flexographic printing element. The customary way to form photopolymerizable flexographic printing elements involves a process wherein the components of the photopolymerizable layer are mixed and melted in an extruder. The melt is subsequently introduced into the nip of a calender introducing the covering and supporting sheets via its heated rolls. In this process, the PET sheets come into contact with the hot photopolymerizable melt and take on the temperature of the melt.

The temperature of the photopolymerizable melt is typically in the range from 120° C. to 150° C., i.e., far above the glass transition temperature of polyethylene terephthalate. Moreover, the resulting combination of photopolymerizable layer with covering and supporting sheets has to be transported through the machine. Shearing forces will be exerted on hot PET sheets in the course of transportation. This means that, after passing through this manufacturing step, even flexographic printing plates made using nonshrinking PET sheets will again have shrinkage values above the required dimensional stability of <0.02%.

Furthermore, it is difficult to use the abovementioned method and nonshrinking PET sheets to make ripple-free flexographic printing plates. Since the tension in the machine direction is higher than perpendicularly to the machine direction, it is advantageous for the PET sheets to have a higher shrinkage in the machine direction than perpendicular thereto. Only in that way is it possible to produce flexographic printing elements that are ripple-free. Yet flexographic printing elements thus obtained will always have some residual shrinkage. It prevents attainment of the required dimensional stability on drying at elevated temperatures.

DETAILED DESCRIPTION OF THE INVENTION

The present invention therefore had for its object to provide photopolymerizable flexographic printing elements for making flexographic printing plates by exposing to light, washing out with organic washout media and drying that are dryable even at temperatures of more than 60° C. without register problems.

We have found that this object is achieved by a photopolymerizable flexographic printing element for making flexographic printing plates which is developable by use of washout media comprising hydrocarbons and which comprises—arranged on top of each other in the stated order—at least a dimensionally stable supporting sheet (A) having a thickness of 50 μm to 300 μm, a photopolymerizable, relief-forming layer (B) which is soluble or dispersible in organic solvents and has a layer thickness of 300 μm to 7000 μm, comprising at least an elastomeric binder, an ethylenically unsaturated monomer and a photoinitiator or photoinitiator system, and a removable coversheet (E), wherein the supporting sheet is a PET sheet whose shrinkage in the longitudinal direction (MD shrinkage) and in the transversal direction (TD shrinkage) as determined by annealing the sheet at 100° C. for 15 minutes is in each case less than 0.02%.

A BRIEF DESCRIPTION OF THE FIGURE

FIG. 1 illustrates a test motif according to the invention with register crosses, 840 mm by 840 mm, the arrow indicating the extrusion direction of the flexographic printing plate.

In a preferred embodiment of the invention, the flexographic printing element further includes a laser-ablatable mask layer (D) between the photopolymerizable layer (B) and the coversheet (E).

The invention further provides methods of forming such flexographic printing elements wherein the supporting sheet (A) is bonded to the photopolymerizable layer (B) at a temperature <60° C.

The invention further provides the method of using the recited flexographic printing elements in the manufacture of flexographic printing plates by washing out with organic solvents wherein the washed flexographic printing plates are dried at a temperature of 60° C. to 120° C., preferably 70° C. to 110° C.

It was found that, surprisingly, such flexographic printing elements, after exposure, can be washed out in organic washout media and dried at temperatures of more than 60° C. and yet nonetheless display excellent accuracy of register.

The invention will now be described in detail:

In what follows, the terms "flexographic printing plate", "flexographic printing form" or "the plate" are used for an already crosslinked, ready-to-print printing form. The term "flexographic printing element" is used, as usual, for the photopolymerizable starting material employed in the manufacture of flexographic printing forms/plates.

Supporting Sheet (A)

The flexographic printing element of the present invention includes a support in the form of a polyethylene terephthalate sheet having a thickness of 50 μm to 300 μm, preferably 75 μm to 250 μm and more preferably 100 μm to 250 μm.

A "nonshrinking" sheet is concerned here. The shrinkage of polymeric sheets is measured in a conventional manner by heating the sheets to a defined temperature and measuring the sheet dimensions before and after said heating/annealing. The values measured were used to compute the shrinkage according to the following formula:

$$\% \text{ shrinkage} = \frac{(\text{initial length} - \text{final length})}{\text{initial length}} * 100$$

Owing to the nature of the process used to produce polymeric sheets, the values for the measurement in the longitudinal direction of the sheet web (also known as the machine direction, abbreviated MD) and transversely to the sheet web (also known as the transversal direction, abbreviated TD) may differ. Therefore, the shrinkage of a polymeric sheet is measured in both the longitudinal direction (MD) and in the transversal direction (TD) relative to the sheet web. A detailed measuring procedure is reported in the experimental part.

According to the present invention, the support employed for the flexographic printing element is a PET sheet having a shrinkage in the longitudinal direction (MD shrinkage) and a shrinkage in the transversal direction (TD shrinkage) of less than 0.02%, the shrinkage being determined by heating/annealing the sheet at 100° C. for 15 minutes.

The PET support sheets used according to the present invention should preferably have at least some UV transparency in order to allow backside pre-exposure of the flexographic printing element. The PET support sheets preferably have a UV transmission measured at 365 nm of not less than 5%, preferably not less than 10%, for example not less than 50%.

The support or supporting sheets may optionally have been treated with customary adhesion-promoting layers. They may further have a coating of UV-absorbing layers in order to reduce excessively high UV transmission.

The polymeric sheets referred to are commercially available.

Relief-Forminq Layer (B)

The flexographic printing element further comprises at least one photopolymerizable, relief-forming layer (B) which is soluble or dispersible in organic solvents, in particular hydrocarbons, and has a layer thickness of 300 μm to 7000 μm, comprising at least an elastomeric binder, an ethylenically unsaturated monomer and a photoinitiator or photoinitiator system. The recited components aside, it is optionally possible for still further components to be present, for example plasticizers.

The elastomeric binder may comprise, for example, thermoplastically elastomeric block copolymers, for example styrene-butadiene or styrene-isoprene block copolymers. A person skilled in the art has in-principle knowledge of relief-forming layer compositions soluble or at least dispersible in organic solvents, and will choose a suitable composition according to the properties desired of the flexographic printing plate.

It will be appreciated that the flexographic printing element of the present invention may also comprise two or more photopolymerizable, relief-forming layers soluble or dispersible in organic solvents and arranged one above the other. Flexographic printing elements having a multilayered construction for the photopolymerizable, relief-forming layer are likewise known to a person skilled in the art.

According to the present invention, the photopolymerizable, relief-forming layer has a thickness of not less than 300 μm, in particular in the range from 300 μm to 7000 μm. Preference is given to a thickness of 1000 μm to 7000 μm, for example 2000 μm to 7000 μm. In a further embodiment of the invention, the thickness is in the range from 3100 μm to 7000 μm.

Laser-Ablatable Mask Layer (D)

The flexographic printing element of the present invention may optionally further comprise a laser-ablatable layer.

The laser-ablatable mask layer (D), also known as an LAMS layer, is soluble or dispersible in organic binders and comprises at least one elastic binder, specifically soft-elastic binders.

It will be appreciated that mixtures of two or more different binders are also employable.

The elastic binders endow the laser-ablatable mask layer (D) with sufficient flexibility and extensibility for the layer not to tear or wrinkle when being mounted on the drum of a laser apparatus. Good adherence to underlying layers should additionally be ensured.

Examples of suitable binders include soft-elastic polyamides. Polyamides of this type include long-chain bifunctional fatty acids as monomeric building blocks to endow the polyamide with soft-elastic properties. It is further possible to use polyester amides, cellulose derivatives, nitrocellulose, ethylene-vinyl acetate copolymers, polyacrylates or mixtures thereof as long as they have soft-elastic properties.

In one preferred embodiment of the invention, the binders concerned are soluble in organic solvents, specifically organic solvents of medium polarity. Examples of solvents having medium polarity include specifically mono- or polyfunctional alcohols having $C_4$ to $C_{12}$ hydrocarbon moieties. The polarity of solvents is describable in an in-principle known manner in terms of the so-called solubility parameter (after Hansen, J. Appl. Polym. Sci., 5 (15), 339 (1961)). The alcohols referred to have solubility parameters in the range from 9 to 12 $(cal/cm^3)^{1/2}$. In layers comprising binders of this type, the remnants of the laser-ablatable mask layer, after imaging and imagewise exposure, can be dissolved and/or washed away using commercially available flexographic washout media comprising apolar hydrocarbons and moderately polar alcohols (e.g., Nylosolv® from Flint Group). Makromelt® 6900 (Henkel AG) soft-elastic polyamide is very useful as binder for the laser-ablatable mask layer.

The laser-ablatable mask layer (D) further comprises UV/VIS-light-absorbing materials, the layer thickness and/or amount of which are determined such that the optical density of the layer in respect of UV/VIS radiation is in the range from 2 to 4. The high optical density ensures that the areas of the relief-forming layers that are concealed by the mask do not polymerize in the course of uniform exposure.

Finely divided carbon black in particular is useful as light-absorbing material. Carbon black is also a very efficient absorber in the IR region and thus, in the course of imaging by IR laser, simultaneously also ensures rapid imaging. It will be appreciated, however, that the laser-ablatable mask layer may also contain other pigment-based UV or IR absorbers or soluble dyes. Carbon black is typically included in an amount of 10 to 50 wt % with respect to the sum total of all components.

The mask layer should be a few µm, preferably from 1 µm to 4 µm in layer thickness. Layer thicknesses below 1 µm make it difficult to achieve adequate optical density. With layer thicknesses above 3 µm, the laser sensitivity of the element is too low, necessitating long lasering times for imaging.

The laser sensitivity of the mask layer (measured as energy needed to ablate 1 m² of the layer) should be between 1 and 4 J/m².

Coversheet (E)

Coversheet (E), which is removable by peeling it off, is the topmost layer of the flexographic printing element and serves inter alia to protect the flexographic printing element. The coversheet is peeled off before the flexographic printing element is used to make flexographic printing plates. Particularly PET sheets of moderate or low roughness are useful as removable coversheets (E). The Rz values may be for example in the range from 1 µm to 3 µm. Mylar® A PET sheet is employable for example.

Construction of Flexographic Printing Element

The flexographic printing element of the present invention comprises an arrangement whereby the supporting sheet (A), the photopolymerizable layer(s) (B), the laser-ablatable mask layer (D) if present, and the coversheet (E) are arranged in that order directly or indirectly one above the other.

The flexographic printing element may further comprise yet other layers: For instance, an elastic underlayer may be included in the flexographic printing element underneath the photopolymerizable layer.

Furthermore, the supporting sheet (A) may for example be provided a coating with an adhesion-promoting layer to ensure better adherence between the supporting sheet (A) and the photopolymerizable layer (B) or an elastic underlayer.

A UVA light transmitting oxygen barrier layer (C) may be arranged between the photopolymerizable layer (B) and the laser-ablatable layer (D). Such a layer (C) limits or prevents the diffusion of oxygen into the photopolymerizable layer during the exposing step and thus contributes to a superior printing result. The barrier layer may, in an in-principle known manner, comprise a polymeric binder having a low oxygen transmission rate. Examples of suitable binders include polyamides, polyvinyl alcohol, hydroxyalkylcellulose, polyvinylpyrrolidone, ethylene-vinyl acetate copolymers, amphoteric interpolymers, cellulose acetabutyrate, alkylcellulose, butyral, cyclic rubbers or combinations thereof. A barrier layer is typically from 0.3 µm to 5 µm in layer thickness. Further details regarding barrier layers are for example disclosed in U.S. Pat. No. 5,262,275 or WO 2012/145111 A1.

The flexographic printing element may further comprise a detacking layer between the coversheet (E) and the laser-ablatable layer (D) to make it easier to peel the cover sheet off before use. Useful binders for a detack layer include, for example, the binders used for a laser-ablatable layer.

Formation of Flexographic Printing Element

To form the flexographic printing element in the manner of the present invention, the supporting sheet (A) is bonded to the photopolymerizable layer (B) at a temperature <60° C.

For example, the components of the photopolymerizable layer are dissolvable in a suitable solvent and/or solvent mixture and pourable onto the supporting sheet at T<60° C.

It is preferable, however, to use methods wherein a prefabricated, solid photo-polymerizable layer (B) is bonded at T<60° C. to the supporting sheet (A) via a lamination process.

Said photopolymerizable flexographic printing elements are obtainable according to various methods.

In a first embodiment of the invention, the method comprises at least steps (1.1) to (1.7).

In this embodiment, a first step (1.1) comprises providing a covering element comprising at least one coversheet (E). The coversheet may be coated with further layers to obtain a multilayered covering element. The coversheet (E) may optionally be coated with a detacking layer, thereafter optionally with a laser-ablatable layer (D) and also optionally a barrier layer (C). The layers are coatable by dissolving the components, casting the solutions in succession onto the coversheet and drying.

In a second step (1.2) the components of the photopolymerizable layer are then melted in an in-principle known manner in a suitable mixing assembly, for example in an extruder, wherefor the temperature of the melt is typically in the range from 120° C. to 170° C.

In a third step (1.3) the melt, again in an in-principle known manner, is imported through a sheet die into the nip of a two-roll calender. The temperature of the melt at this stage is typically in the range from 120° C. to 170° C., depending on the formulation. The coated coversheet is introduced via one of the rolls. A temporary, removable supporting sheet is imported via the other roll. The temporary sheet used may be, for example, a siliconized PET sheet or a release-coated PET sheet.

In a fourth step (1.4) the composite of temporary supporting sheet, photopolymerizable layer and covering element (E) is calendered by the calendering rolls.

After passing through the calender, the composite of temporary supporting sheet, photopolymerizable layer and covering element is cooled down to temperatures below 60° C. in a fifth step.

A sixth step (1.6) comprises peeling the temporary supporting sheet off the photo-polymerizable layer even during or after the cooling period.

Once the temperature of the composite has decreased to below 60° C., the supporting sheet (A) to be used according to the present invention is bonded to the photopolymerizable layer (B) in a seventh step (1.7) in a firmly adherent manner.

Said bonding step may be effected via a second calender or a lamination apparatus. To bond the supporting sheet to the photopolymeric layer in a firmly adherent manner, it may be advantageous to provide a primer to the supporting sheet and/or to briefly expose the composite to UV light through the supporting sheet. The intensity and/or duration of this exposure is limited such that while adherence is improved, significant parts of the photopolymerizable layer are not polymerized.

In a second embodiment, a flexographic element is obtainable by first of all, in a first step (2.1), providing a covering element comprising at least the coversheet (E). Details were described above under step (1.1).

In a second step (2.2) the components of the photopolymerizable layer are then melted in an in-principle known manner in a suitable mixing assembly, for example in an extruder, wherefor the temperature of the melt is typically in the range from 120° C. to 170° C.

In a third step (2.3) the above-described covering element is coated with the photo-polymerizable melt. This is done using a sheet die which delivers a consistent thickness of layer across the full width of application. Appropriate dies and techniques for establishing thickness consistency are known to a person skilled in the art. In principle, this technique may also be used to apply photopolymerizable layers through two successive dies, for example a first photopolymerizable layer and a thin toplayer. A calendering step is not practiced at this stage.

In a fourth step (2.4) the composite of coated coversheet and photopolymerizable layer is initially cooled down to a temperature of less than 60° C.

Once the temperature is below 60° C., the supporting sheet (A) is laminated onto the photopolymerizable layer in a fifth step (2.5). This bonding step may be effected via a calender or some other apparatus for lamination. Good adherence between the supporting sheet and the photopolymerizable layer may optionally be established by coating the supporting sheet with a primer and/or by briefly and incipiently exposing the photopolymerizable layer to UV light through the supporting sheet.

In a third embodiment, a flexographic element is obtainable by first of all, in a first step (3.1), providing a covering element comprising at least the coversheet (E). Details were described above under step (1.1).

In a second step (3.2) the components of the photopolymerizable layer are then melted in an in-principle known manner in a suitable mixing assembly, for example in an extruder, wherefor the temperature of the melt is typically in the range from 120° C. to 170° C.

In a third step (3.3) the above-described covering element is coated with the photo-polymerizable layer. Details regarding this process have already been described.

The composite of coated coversheet and photopolymerizable layer is completely cooled down in a step (3.4) ready for subsequent winding up.

In a fifth step (3.5) the wound package obtained is unwindable and then subsequently bondable to the supporting sheet (A) in a laminating machine or calendering unit at temperatures <60° C.

The method of the present invention, wherein the photopolymerizable layer (B) is bonded to the supporting sheet (A) at T<60° C., has the advantage that the low-shrinkage supporting sheet (A) is not impaired by heating to higher temperatures. The photopolymerizable melt typically has a temperature of about 120° C. to 170° C., and the thin supporting sheet rapidly heats up to that temperature on contact with the melt. In the method which the invention provides for forming flexographic printing elements, the temperature stressing the sheet stays below 60° C. to obtain flexographic printing elements having particularly good dimensional stability.

The present invention also provides a flexographic printing element comprising
- a dimensionally stable supporting sheet (A) having a thickness of 50 μm to 300 μm,
- a photopolymerizable, relief-forming layer (B) which is soluble or dispersible in organic solvents and has a layer thickness of 300 μm to 7000 μm, comprising at least an elastomeric binder, an ethylenically unsaturated monomer and a photoinitiator or photoinitiator system, and
- optionally an oxygen barrier layer (C),
- optionally a laser-ablatable mask layer (D), and
- a removable coversheet (E), wherein the supporting sheet is a PET sheet whose shrinkage in the longitudinal direction (MD shrinkage) and in the transversal direction (TD shrinkage)—as determined by annealing the sheet at 100° C. for 15 minutes—is in each case less than 0.02%, and wherein the flexographic printing element is obtainable by a method wherein the supporting sheet (A) is bonded to the photopolymerizable layer (B) at a temperature <60° C.

Use of Flexographic Printing Elements to Make Flexographic Printing Plates

The flexographic printing elements of the present invention are used for making flexographic printing plates. The manner of platemaking here depends on which flexographic printing element is used.

One embodiment of the invention comprises a digitally imageable flexographic printing element which in addition to the supporting sheet (A), the photopolymerizable layer (B) and the coversheet (E) further comprises at least a laser-ablatable mask layer (D). The digitally imageable flexographic printing element may yet further also comprise an oxygen barrier layer (C).

Initially, in an in-principle known manner, the coversheet (E) is removed from the flexographic printing element. Then, in an in-principle known manner, a mask is written into the laser-ablatable mask layer (D) using an IR laser. Laser apparatuses for inscribing masks are known to a person skilled in the art and are commercially available. In principle, any commercially available lasers (predominantly they are external drum lasers) are useful.

Subsequently, the imaged flexographic printing element is exposed to UV or UV-VIS radiation through the resulting mask in an in-principle known manner. The photopolymerizable layer polymerizes in the areas no longer concealed by the mask, whereas no polymerization takes place in the concealed areas. Apparatuses for exposing flexographic printing plates to light are in principle known to a person skilled in the art. The flexographic printing elements may be exposed to light using commercially available tube-type exposure units or UV-LED high-energy strips.

The main exposure through the mask may optionally be preceded by a backside pre-exposure through the supporting sheet (A). The backside pre-exposure effects complete polymerization of the floor of the photopolymerizable layer. The floor is what holds the relief elements in place to ensure that the relief elements are not damaged during printing. The thicker the flexographic printing plate, the thicker the floor. This may be controlled by exposure duration and intensity. Typical back-exposure times with customary exposure units are, for example, about 20 to 120 s, without the invention thereby being limited to this range.

The advantage with the supporting film (A) used according to the invention being composed of PET is that said sheet has at least some UV transmissivity. PEN sheets have a high level of UV absorption and block UV light virtually completely at below about 380 nm and thus make at least the process of backside pre-exposure more difficult.

After exposure, the remnants of the laser-ablatable mask layer (D) and also the unpolymerized fractions of the relief-forming layer (B) are removed by using an organic washout medium. If present, a barrier layer (C) is also removable in the washout step. This can be accomplished using customary washout equipment, in particular by use of flat-bed washout equipment.

In one embodiment of the invention, the digitally imageable flexographic printing element does not include a prefabricated barrier layer (C); instead, after the step of writing a mask into the laser-ablatable layer (D), a thin, UV-transmissive protective sheet, for example a thin PET sheet, is laminated in place to protect the photo-polymerizable layer from oxygen during exposure. After exposure, said sheet is peeled off again and the flexographic printing element may be washed out as described.

In a preferred embodiment of the invention, the washout medium used comprises hydrocarbons. The hydrocarbons in question may more particularly be high-boiling aliphatic, cycloaliphatic or aromatic hydrocarbon fractions, in particular those having a boiling range of from 160 to 220° C. In a preferred embodiment of the invention, the washout medium comprises 60 wt % to 95 wt % of hydrocarbons and 5 wt % to 40 wt % of alcohols. It will be readily appreciated that the alcohols concerned are alcohols that are miscible with the hydrocarbons. The rule is to employ mono-alcohols having 4 or more carbon atoms, preferably 5 or more carbon atoms, for example from 5 to 10 carbon atoms. Examples include n-pentanol, cyclohexanol, benzyl alcohol, heptyl alcohols or 2-ethylhexanol.

The flexographic printing plate obtained in the present invention is subsequently dried at a temperature of more than 60° C. to 120° C., in particular 70° C. to 120° C. The drying temperature is preferably in the range from 70° C. to 110° C., and more preferably from 80° C. to 100° C., for example from 90° C. to 100° C. The drying step may be carried out in, for example, dryers with drawers.

Finally, the flexographic printing plate obtained is aftertreatable with UV-A and/or UV-C light in an in-principle known manner.

The method of making flexographic printing forms may self-evidently comprise still further steps. For instance, a multi-step development by using different solvents and/or solvent mixtures is also conceivable.

The flexographic printing elements of the present invention have the advantage that they are dryable even at comparatively high temperatures, particularly 90° C. to 100° C., without the dimensional stability of the flexographic printing plate being impaired. The higher temperature shortens the drying time significantly.

A further embodiment utilizes flexographic printing elements that do not have a laser-ablatable mask layer. The step of peeling off the coversheet (E) is followed by a step of laying or laminating a mask onto the photopolymerizable layer (B) and a step of exposing the imaged flexographic printing element to UV radiation through the mask. The mask may be a conventional photographic mask for example. Preferably, the mask is a digitally imageable mask which is first imaged using a laser apparatus. The imaged mask is subsequently laid on or preferably laminated onto the photopolymerizable layer (B). After exposure, the mask may be peeled off the imagewise exposed layer or else removed using the washout medium—depending on the mask type.

In the embodiment referred to, the photopolymerizable layer (B) may optionally be provided a coating with a detack layer. The detack layer makes it easier to peel off the coversheet (E) and prevents a mask laid on the photopolymerizable layer from firmly sticking thereto, and instead ensures that it can be peeled off again.

The examples which follow illustrate the invention.

EXAMPLES

Support Sheets Used

Procedure for determination of sheet shrinkage:

A sheet web is taken and a piece 25 cm×25 cm is cut to size out of the middle. The sample is then hole punched with an A4 hole puncher on the longitudinal and transversal sides at an interval of 20 cm. A measuring ruler (from Messerli) is then used to measure the separations of the punched holes from inside edge to inside edge. The sample is subsequently annealed for 15 minutes at the stated temperature in a circulating air drying cabinet. After cooling, the separations are remeasured and the shrinkage value is computed.

$$\% \text{ shrinkage} = \frac{\text{(initial length} - \text{final length)}}{\text{initial length}} * 100$$

Shrinkage is determined not only in the longitudinal direction of the sheet web (also known as the machine direction, MD for short) but also transversely to the sheet web (also known as the transversal direction, TD for short). MD shrinkage and TD shrinkage may differ in any one case.

The PET sheets reported below in table 1 were used. One PET sheet is a "nonshrinking" sheet to be used for the purposes of the present invention while the other one is a standard PET sheet used for purposes of comparison. Transmission in respect of UV radiation was measured in each case as well as shrinkage.

The table also includes, for comparison, two PEN sheets (Teonex® Q83 and Teonex® Q51, both from DuPont Teijin Films). The UV transmission of the two PEN sheets is so high even at the lower layer thickness as to rule out any backside exposure of the flexographic printing element through the support sheet as not possible in practice. But this means that the flexographic printing elements are no longer processable into flexographic printing plates of high quality.

TABLE 1

| | Material | Name | Thickness [μm] | UV transmission [%] at 365 nm | MD 60° C. | MD 100° C. | MD 150° C. | TD 60° C. | TD 100° C. | TD 150° C. |
|---|---|---|---|---|---|---|---|---|---|---|
| "Nonshrinking" sheet | PET | Melinex ® ST 506* | 175 | 76.9% | — | 0.01 | 0.01 | — | 0.02 | 0.04 |
| Standard | PET | standard PET sheet | 175 | | 0.06 | 0.52 | — | 0.04 | 0.214 | — |
| | PEN | Teonex ® Q83* | 125 | 0.09% | | | | | | |
| | PEN | Teonex ® Q51*, | 125 | 0.06% | | | | | | |

(*manufacturer: Dupont-Teijin)

A) Production of Inventive Flexographic Printing Elements

Laser-ablatable photopolymerizable flexographic printing elements of the type Nyloflex® ACE 114 D (overall thickness 1.14 mm) in the 900×1200 mm format were manufactured in a conventional manner: The constituents of the photo-polymerizable layer were melted and mixed in an extruder and the melt extruded at a temperature of 145° C. through a sheet die into a calender nip. One calendering roll carries in the usual manner a covering element comprising a protective sheet and a laser-ablatable layer applied thereto. The other calendering roll imported into the nip, in place of the usual supporting sheet, a temporary sheet in the form of a PET sheet provided a detacking layer. The calendering rolls had a temperature of 85° C. and the composite of covering element, photopolymerizable layer and temporary supporting sheet was calendered between the calendering rolls and subsequently cooled down.

To form the inventive flexographic printing element, the temporary PET sheet was peeled off together with the detacking layer. The flexographic printing elements were preheated to 50° C. and bonded to a "nonshrinking" primered PET supporting sheet 175 μm in thickness (Melinex® ST 506, Dupont-Teijin) in a firmly adherent manner in a laminator without application of tensile forces. The shrinkage values and the UV transmissivity of the sheet are reported in table 1.

B) Processing of Photopolymerizable Flexographic Printing Elements into Flexographic Plates First the coversheet was peeled off the photopolymerizable flexographic printing elements and then a motif (840 mm×840 mm, see FIG. 1) was written into the laser-ablatable layer by using a commercially available apparatus for laser ablation (Esko CDI Spark 5080).

Register crosses were made on the motif on each side. The separation between the register crosses should be precisely 820 mm according to the datafile used. The separation was then checked by a measurement. What was measured was in each case the separation between the register crosses on each of the four sides of the motif. The arrow in FIG. 1 indicates the direction in which the plates were originally extruded. The measurements were performed using a glass ruler with microscopic capture of the measurement crosses (electronic scale, from M-Service).

Each measurement was repeated five times and a mean was calculated.

The lasered flexographic printing elements were subsequently processed into a flexographic printing plate in a conventional manner, specifically via the steps of:

UVA backside exposure 9 seconds (Nyloflex® Combi F III from Flint Group)

UVA main exposure 15 minutes (Nyloflex® Combi FIII from Flint Group)

washout speed 270 mm/min (Nyloflex® FV inline washer from Flint Group)

Nyloflex® E (Flint Group) washout medium at a washout temperature of 35° C.

The washed flexographic printing plates were subsequently dried in a Nyloflex® Combi F III dryer with drawers at different temperatures for different lengths of time, specifically:

Example 1: 120 minutes at 60° C.

Example 2: 40 minutes at 80° C.

Example 3: 20 minutes at 100° C.

Thereafter, the flexographic printing plates were fetched out of the dryer, cooled down to room temperature and aftertreated in the standard way with UVA and UVC light. The separation of the measurement crosses was then remeasured on each side of the flexographic printing plate as described above and the ratio was formed between the difference of the measured value and the original length. This ratio (%) is a measure of how the dimensions of the plate changed as a result of the differing processing. The geometry error of the method of measurement is plus/minus 0.01%.

In comparative tests, a standard plate (Nyloflex® ACE 114 D) comprising a conventional supporting sheet was processed as described and dried at different temperatures. The shrinkage values of the sheet are reported in table 1.

Comparative Example 1 (V1): 120 minutes at 60° C.

Comparative Example 2 (V2): 20 minutes at 100° C.

The results are summarized in table 2:

In further Comparative Example 3 a photopolymerizable flexographic printing element was formed by the usual method as described above, except that the temporary PET sheet was replaced by using the above-described nonshrinking primered PET support sheet (Melinex® ST 506, Dupont-Teijin).

Accordingly, this sheet was exposed to high temperatures due to the liquid photo-polymerizable layer melt in the course of the production process. The tests had to be discontinued, since the sheet became so badly warped as to result in the formation of ripples on the flexographic printing element.

TABLE 2

Shrinkage/elongation of tested flexographic printing plates as a function of sheet and drying conditions. Positive values indicate plate elongation, negative values indicate shrinking.

| Example | PET sheet | Drying Temperature [° C.] | Time [min] | Shrinkage/elongation [%] Side 1 (MD) | Side 2 (TD) | Side 3 (MD) | Side 4 (TD) |
|---|---|---|---|---|---|---|---|
| 1 | nonshrinking | 60 | 120 | 0.008 | 0.006 | 0.003 | −0.004 |
| 2 | nonshrinking | 80 | 40 | 0.007 | 0.005 | 0.000 | 0.012 |
| 3 | nonshrinking | 100 | 20 | −0.009 | −0.004 | −0.012 | 0.009 |
| V1 | standard | 60 | 120 | −0.012 | −0.014 | −0.013 | −0.005 |
| V2 | standard | 100 | 20 | −0.254 | −0.007 | −0.255 | −0.043 |

The results demonstrate that conventional flexographic printing plates shrink severely and differently on drying at temperatures above the glass transition temperature of the polyester support sheet (Comparative Example 2). Such a plate is unusable for high-quality flexographic printing. The plates which are in accordance with the present invention (Examples 1 to 3), by contrast, all without exception display shrinkage/elongation values below the experimental error. These plates are suitable for high-quality flexographic printing.

Surprisingly, the measured values on the flexographic printing plates of the present invention are even lower than in Comparative Example 1, wherein a standard flexographic printing plate was dried at a standard temperature of 60° C.

Effect of Sheet on Backside Pre-Exposure:

The effect of the sheet on the backside pre-exposure is shown by the experiments which follow. Laser-ablatable photopolymerizable flexographic printing elements of the type Nyloflex® ACE 170 D (overall thickness 1.70 mm) were formed by the above procedure. The supporting sheets used were two different 125 μm thick PEN sheets (Teonex® Q83 and Teonex® Q51, both from DuPont Teijin Films) and for comparison a 125 μm thick PET sheet (Melinex® D 740, likewise DuPont Teijin Films). As usual, backside pre-exposure was used to establish the 800 μm relief depth required for this plate thickness, and in each case the exposure time required for this was determined. The results are summarized in table 3.

TABLE 3

Duration of backside pre-exposure in various supporting sheets

| | Sheet species | Backside pre-exposure time |
|---|---|---|
| Teonex ® Q51 | PET, 125 μm | >1000 s |
| Teonex ® Q83 | PEN, 125 μm | >1000 s |
| Melinex ® D 740 | PEN, 125 μm | 65 s |

The results show that the customary duration for backside pre-exposure is obtained only on using the PET sheet. The use of PEN sheets requires exposure times beyond what is acceptable in commercial practice.

What is claimed is:

1. A method of making a photo-polymerizable, flexographic printing element that can be developed with washout media that includes hydrocarbons, the printing element comprising sheets or layers arranged on top of each other in the stated order:
   a dimensionally stable polyethylene terephthalate (PET) supporting sheet (A) having a thickness of 50 μm to 300 μm, and whose shrinkage in the longitudinal direction (MD shrinkage) and in the transversal direction (TD shrinkage), as determined by annealing the sheet at 100° C. for 15 minutes, is in each case less than 0.02%;
   a photopolymerizable, relief-forming layer (B), which is soluble or dispersible in organic solvents and has a layer thickness of 300 μm to 7000 μm, comprising at least an elastomeric binder, an ethylenically unsaturated monomer and a photoinitiator or photoinitiator system; and
   a coversheet (E),
   wherein the method comprises at least the steps of;
   (1.1) providing a covering element comprising at least one coversheet (E),
   (1.2) melting and mixing the components of the photopolymerizable, relief-forming layer in a mixing assembly at a temperature of 120° C. to 170° C.,
   (1.3) forming a composite of temporary supporting sheet by exporting the melt through a sheet die into the nip of a calender while importing into said nip a temporary supporting sheet via one roll of the calender and the covering element via the other roll of the calender,
   (1.4) calendering the composite of temporary supporting sheet, photopolymerizable layer and covering element,
   (1.5) cooling the composite of temporary supporting sheet, photopolymerizable layer and covering element down to a temperature less than 60° C.,
   (1.6) peeling the temporary supporting sheet off the photopolymerizable layer (B), and
   (1.7) bonding the composite, cooled down to temperatures of less than 60° C., with a side of the photopolymerizable layer to the PET supporting sheet.

2. The method of claim 1, wherein the temporary sheet comprises a siliconized PET sheet or a release-coated PET sheet.

3. The method of claim 1, wherein the coversheet (E) includes a laser-ablatable mask layer (D).

4. The method of claim 3, wherein the coversheet (E) includes an oxygen barrier layer.

5. The method of claim 1, wherein the step of bonding (1.7) includes a lamination process or a calendaring process.

6. The method of claim 1, wherein the photo-polymerizable, flexographic printing element includes a UV transmission measured at 365 nm of not less than 5%.

7. The method of claim 4, further comprising drying the flexographic printing element at a temperature in a range from 80° C. to 100° C.

8. The method of claim 2, wherein the coversheet (E) includes a laser-ablatable mask layer (D).

9. The method of claim 8, wherein the coversheet (E) includes an oxygen barrier layer.

10. The method of claim 9, wherein the step of bonding (1.7) includes a lamination process or a calendaring process.

11. The method of claim 10, wherein the photo-polymerizable, flexographic printing element includes a UV transmission measured at 365 nm of not less than 5%.

12. The method of claim 11, further comprising drying the flexographic printing element at a temperature in a range from 80° C. to 100° C.

13. The method of claim 1, wherein said PET supporting sheet (A) having a thickness of 75 μm to 250 μm.

14. The method of claim 1, wherein said PET supporting sheet (A) having a thickness of 100 μm to 250 μm.

15. The method of claim 1, wherein the photo-polymerizable, flexographic printing element includes a UV transmission measured at 365 nm of not less than 10%.

16. The method of claim 1, wherein the photo-polymerizable, flexographic printing element includes a UV transmission measured at 365 nm of not less than 50%.

17. The method of claim 1, wherein the photopolymerizable, relief-forming layer (B), which is soluble or dispersible in organic solvents and has a layer thickness of 1,000 μm to 7,000 μm.

18. The method of claim 1, wherein the photopolymerizable, relief-forming layer (B), which is soluble or dispersible in organic solvents and has a layer thickness of 3,100 μm to 7,000 μm.

\* \* \* \* \*